United States Patent [19]
Aizenberg et al.

[11] Patent Number: 6,078,101
[45] Date of Patent: Jun. 20, 2000

[54] HIGH-POWER MICROWAVE-FREQUENCY HYBRID INTEGRATED CIRCUIT

[75] Inventors: Eduard Volfovich Aizenberg; Vladimir Iljich Bejl, both of Fryazino; Yurij Petrovich Klyuev, Moscow, all of Russian Federation

[73] Assignee: Samsung Electronics Co., Ltd., Suwon, Rep. of Korea

[21] Appl. No.: 09/117,758

[22] PCT Filed: Dec. 4, 1996

[86] PCT No.: PCT/RU96/00336

§ 371 Date: Apr. 28, 1999

§ 102(e) Date: Apr. 28, 1999

[87] PCT Pub. No.: WO98/25306

PCT Pub. Date: Jun. 11, 1998

[51] Int. Cl.[7] .......................... H01L 23/04; H01L 23/043
[52] U.S. Cl. .......................... 257/699; 257/698; 257/700; 257/708; 257/709
[58] Field of Search .................................... 257/680, 687, 257/698, 699, 700, 708, 709

[56] References Cited

U.S. PATENT DOCUMENTS

| | | | |
|---|---|---|---|
| 5,753,976 | 5/1998 | Harvey | 257/774 |
| 5,814,883 | 9/1998 | Sawai et al. | 257/712 |
| 5,942,796 | 8/1999 | Mosser et al. | 257/712 |

*Primary Examiner*—Ngân V. Ngô
*Attorney, Agent, or Firm*—Lackenbach Siegel Marzullo Aronson & Greenspan, P.C.

[57] ABSTRACT

In a high-power microwave hybrid integrated circuit comprising package-free semiconductor devices 5 with contact pads, a dielectric substrate 1 containing holes 3 and a topological pattern on its front side and a shielding metallization 2 on its opposite side, a metallic header 4 with projections 6 adjoining the shielding metallization 2 of the dielectric substrate 1 and passing through the holes 3 thereof, said semiconductor devices 5 being mounted on the projections 6 of the header 4 such that their surfaces with the contact pads flush level with a front side of the dielectric substrate 1, a part of said contact pads being connected to the topological pattern of the metallization and a part thereof being connected to the projections 6 of the header 4, the improvements consisting in that the metallic header 4 is provided with holes 3 where its projections 6 are mounted, said projections 6 being fabricated in the form of inserts rigidly secured in said holes 3 and made of material with a thermal conductivity coefficient which is greater than the thermal conductivity coefficient of material of the metallic header 4. In so doing, the cross-sectional area of the insert 6 in the region of securing thereof in the hole 3 of the metallic header 4 is at least 8 time as high as the area of an adjoining surface of the package-free semiconductor devices 5; the contacting area of the insert 6 with a surface of the shielding metallization 2 of the dielectric substrate 1 does not exceed ⅙ of its own surface area. Besides, the metallic header 4 is made of material having a thermal coefficient of linear expansion close to the thermal coefficient of linear expansion of the dielectric substrate 1.

7 Claims, 1 Drawing Sheet

HIGH-POWER MICROWAVE-FREQUENCY HYBRID INTEGRATED CIRCUIT

FIELD OF THE INVENTION

The present invention relates to the art of semiconductor microminiature electronics and electronic engineering, and more particularly to microwave hybrid integrated circuits. This invention may be used with solid-state modules of an enhanced microwave power level, in particular with microwave amplifiers.

BACKGROUND OF THE INVENTION

There has been known a hybrid integrated circuit comprising a multilayer printed circuit board with a flexible planar electrically insulating laminate having an electrically conductive array for connecting to electrical conductor terminals on circuit or component packages or carriers, interconnections for the array being by electrical conductor elements at one or more planes within the laminate. The flexible laminate has holes provided where the packages or carriers are to be secured. A separate rigid metallic heat sinking or spreading member is applied such that protruding thermally conducting metallic pillars thereon pass through the holes in the laminate to contact the packages or carriers. One or more further rigid members, which may also be of thermally conducting material, may be applied to the top of the packages or carriers, clips being arranged to secure the pillars in contact with the packages or carriers. The flexibility of the laminate allows concentration of thermal expansion mismatch between the laminate and the packages or carriers. The laminate is also able to flex or bend in regions between the packages or carriers to optimise contact between the pillars and the packages or carriers and to minimise risk of detachment of the latter from the board. [See GB Patent No. 2 129 223, H 05K 1/18, 1984].

Main disadvantages of that design reside in the complexity of using as modular circuit components, package-free semiconductor devices, for example transistors in the form of crystals, and also in unsatisfactory electric characteristics in the light of providing a required level of output power.

The closest prior art has been disclosed in a high-power microwave hybrid integrated circuit comprising package-free semiconductor devices with contact pads, a dielectric substrate containing holes and a topological pattern on its front side and a shielding metallization on its opposite side, a metallic header with projections adjoining the shielding metallization of the dielectric substrate and passing through the holes thereof, said semiconductor devices being mounted on the projections of the header such that their surfaces with contact pads flush level with a front side of the dielectric substrate, a part of said contact pads being connected to the topological pattern of the metallization and a part thereof being connected to the projections of the header. [See the Journal of "Electronics", Series 1: "Microwave Equipment", Issue No. 1(467), 1996]. In this case, a metallic header is fabricated of copper-molybdenum pseudoalloys to obtain dielectric substrate—metallic header seals which are relatively consistent by a thermal coefficient of linear expansion (TCLE) [hereinafter referred to as "TCLE-consistent"].

However, the proposed design can not be applied when providing miniature modules of an enhanced microwave power level because a proper heat sinking from package-free semiconductor devices is not provided for and a reliable contact of the projections with the shielding metallization of the dielectric substrate is not properly ensured.

SUMMARY OF THE INVENTION

The present invention is made in order to avoid the above-mentioned limitations included in the prior art and it is therefore an object of the invention to provide a high-power microwave hybrid integrated circuit design which allows:

a significant expansion of functional capabilities of modular-type high-power microwave devices due to the possibility to concentrate heat releasing package-free semiconductor devices per unit of a circuit area while increasing a dielectric substrate area to locate microwave circuits;

improvement in operate reliability of microwave hybrid integrated circuits over a wide temperature range at the expense of enhancing heat sinking from heat releasing package-free semiconductor devices and using TCLE-consistent dielectric substrate—metallic header joints;

reduction of overall dimensions of high-power microwave hybrid integrated circuits owing to the possibility of locating a topological pattern and heat releasing package-free semiconductor devices on a, single dielectric substrate measuring up to 48×60 mm.

These and other objects are solved in accordance with the present invention by means of a high-power microwave hybrid integrated circuit comprising package-free semiconductor devices with contact pads, a dielectric substrate containing holes and a topological pattern on its front side and a shielding metallization on its opposite side, a metallic header with projections adjoining the shielding metallization of the dielectric substrate and passing through the holes thereof, said semiconductor devices being mounted on the projections of the header such that their surfaces with contact pads flush level with a front side of the dielectric substrate, a part of said contact pads being connected to the topological pattern of the metallization and a part thereof being connected to the projections of the header, the metallic header is provided with the holes where its projections are mounted, said projections being fabricated in the form of inserts rigidly secured in said holes and made of material having a thermal conductivity coefficient which is greater than the thermal conductivity coefficient of material of the metallic header.

In so doing, the cross-sectional area of the insert in the region of securing thereof in the hole of the metallic header is at least 8 time as high as the area of an adjoining surface of the package-free semiconductor devices.

Furthermore, the contacting area of the insert with a surface of the shielding metallization of the dielectric substrate does not exceed ⅙ of its own surface area.

The metallic header is made of material having a thermal coefficient of linear expansion close to the thermal coefficient of linear expansion of the dielectric substrate.

BRIEF DESCRIPTION OF THE DRAWINGS

The various objects, advantages and novel features of the present invention will be more readily apparent from the following detailed description when read in conjunction with the appended drawings, in which.

Throughout the drawings, like reference numerals should be understood to refer to like components.

DETAILED DESCRIPTION OF THE PREFERRED EMBODIMENT

Figure 1:
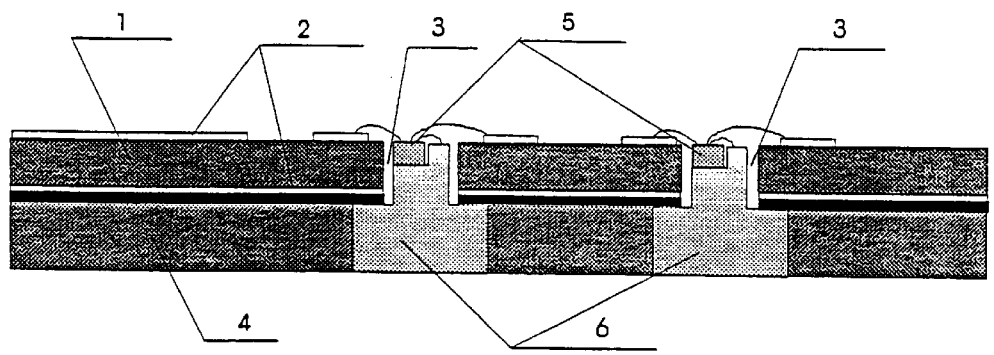
FIG. 1 illustrates a sectional view of a two-stage amplifier designed in accordance with the present invention.

Referring to FIG. 1, the above-mentioned amplifier consists of a dielectric substrate 1 containing holes 3 and a topological pattern on its front side and a shielding metallization 2 on its opposite side; a metallic header 4; package-free semiconductor devices 5 mounted on projections made in the form of inserts 6. The metallic header design is a plate fabricated of material having TCLE close to TCLE of the dielectric substrate, and having holes into which projections to accommodate heat releasing package-free semiconductor devices are incorporated (soldered-in, embedded, etc.), said projections being fabricated in the form of inserts made of material having a thermal conductivity coefficient which is greater than the thermal conductivity coefficient of material of the metallic header (for example, made of copper).

As regards microwave amplifiers used in such equipment, the most stringent requirements are to be specified to stability of electric characteristics (output power, output signal phase) in time depending upon the ambient temperature (−10° C.~+55° C.) and upon an output power level. The most important operating parameter of such amplifiers also resides in minimum- or mean-time-between-failures.

The proposed amplifier design provides for practically the same operating and electric characteristics as with the amplifier design employing a header fabricated entirely of copper.

BEST MODE TO CARRY OUT THE INVENTION

Figure 2:
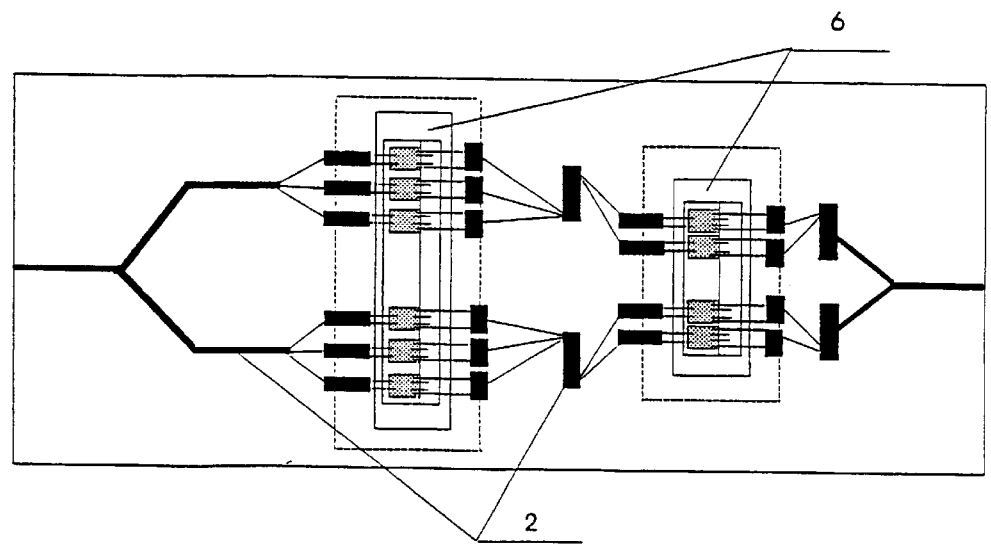
FIG. 2 illustrates a top view of the amplifier of FIG. 1, as viewed from the side of a topological pattern on a dielectric substrate.

The most successful embodiment of the present invention may be a microwave amplifier in which power values of fifteen four-watt package-free semiconductor devices in the form of GaAs-transistor crystals are combined. The circuit of such amplifier is realized on a ceramic (Polycor-type) substrate which is 60×48×0.5 mm overall, wherein each crystal measures 2.5×1.5 mm. The design of such amplifier is similar to that depicted in FIGS. 1, 2.

From the standpoint of the TCLE-consistency of the dielectric substrate metallic header soldered joint as material of the metallic header, it seems to be worthwhile to use metal having TCLE as close as possible to TCLE of the dielectric substrate; where, for example, Polycor is used as the dielectric substrate, then alloy such as Kovar (Registered Trade Mark) is deemed to be the most preferable as the substrate metal.

In the majority of cases, however, copper—molybdenum pseudoalloys are used as the substrate metal for high-power microwave hybrid integrated circuits, depending upon requirements to be specified to the circuit. As to the thermal conductivity, copper—molybdenum pseudoalloys are at a disadvantage in relation to copper but compare favourably with Kovar. At the same time, relative to a degree of TCLE-consistency, these alloys are superior to copper but compare unfavourably with Kovar. With this in mind, the use of such alloys as the substrate material has certain limitations both as to a level of power dissipation and as to the greatest possible microwave clearance diagrams of integrated circuits.

The use as a material of headers, of for example Kovar, into which special inserts (projections) being pre-incorporated in the places of mounting heat releasing elements made, for example of copper, makes it possible to considerably improve heat sinking from the unit area of projections and significantly expand the limits of overall dimensions of high-power microwave integrated circuits. In so doing, it has been determined for practical purposes that the cross-sectional area of the heat sinking insert in the region of securing thereof in the hole of the metallic header must be at least 8 time as high as the area of an adjoining surface of the heat releasing package-free semiconductor devices to be mounted; otherwise, overheat of the heat releasing elements in the integrated circuit operation (especially under elevated temperatures) and its failure are possible.

On the other hand, the tests performed have showed that the contacting area of the insert with a surface of the dielectric substrate should not exceed ⅙ of its own surface area since, otherwise, in those regions where the inserts adjoin the dielectric substrate surface, shear stresses arise owing to differences in TCLE values of the substrate and material of the inserts, which results in failure of the joint, particularly at elevated and reduced temperatures.

The design of high-power microwave hybrid integrated circuits with optimal relations of areas: heat sinking inserts—heat releasing package-free semiconductor devices and dielectric substrate—metallic header—heat sinking inserts has been practically realized when providing microwave power amplifiers for microwave radio-relay links, in aviation, and they have showed a high operate reliability in the course of durability tests under stringent climatic and mechanical actions.

Although the present invention has been described with reference to a preferred embodiment, the invention is not limited to the details thereof, and various changes and modifications obvious to one skilled in the art to which the invention pertains are deemed to be within the spirit, scope and contemplation of the invention as further defined in the appended claims.

What is claimed is:

1. A high-power microwave hybrid integrated circuit comprising package-free semiconductor devices 5 with contact pads, a dielectric substrate 1 containing holes 3 and a topological pattern on its front side and a shielding metallization 2 on its opposite side, a metallic header 4 with projections 6 adjoining the shielding metallization 2 of the dielectric substrate 1 and passing through the holes 3 thereof, said semiconductor devices 5 being mounted on the projections 6 of the header 4 such that their surfaces with contact pads flush level with a front side of the dielectric substrate 1, a part of said contact pads being connected to the topological pattern of the metallization and a part thereof being connected to the projections 6 of the header 4, characterized in that the metallic header 4 is provided with the holes 3 where its projections 6 are mounted, said projections 6 being fabricated in the form of inserts rigidly secured in said holes 3 and made of material having a thermal conductivity coefficient which is greater than the thermal conductivity coefficient of material of the metallic header 4.

2. A high power microwave hybrid integrated circuit according to claim 1, characterized in that the cross-sectional area of the insert 6 in the region of securing thereof in the hole 3 of the metallic header 4 is at least 8 time as high as the area of an adjoining surface of the package-free semiconductor devices 5.

3. A high power microwave hybrid integrated circuit according to claim 1, characterized in that the contacting area of the insert 6 with a surface of the shielding metallization 2 of the dielectric substrate 1 does not exceed ⅙ of its own surface area.

4. A high power microwave hybrid integrated circuit according to claim 2, characterized in that the contacting area of the insert 6 with a surface of the shielding metallization 2 of the dielectric substrate 1 does not exceed ⅙ of its own surface area.

5. A high power microwave hybrid integrated circuit according to claim 1, characterized in that the metallic header 4 is made of material having a thermal coefficient of linear expansion close to the thermal coefficient of linear expansion of the dielectric substrate 1.

6. A high power microwave hybrid integrated circuit according to claim 2, characterized in that the metallic header 4 is made of material having a thermal coefficient of linear expansion close to the thermal coefficient of linear expansion of the dielectric substrate 1.

7. A high power microwave hybrid integrated circuit according to claim 3, characterized in that the metallic header 4 is made of material having a thermal coefficient of linear expansion close to the thermal coefficient of linear expansion of the dielectric substrate 1.

* * * * *